United States Patent
Yoon (10) Patent No.: US 8,929,172 B2
(45) Date of Patent: Jan. 6, 2015

(54) PIPE REGISTER CIRCUIT AND SEMICONDUCTOR MEMORY APPARATUS HAVING THE SAME

(75) Inventor: Hyun Su Yoon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 177 days.

(21) Appl. No.: 13/602,240

(22) Filed: Sep. 3, 2012

(65) Prior Publication Data

US 2013/0279271 A1    Oct. 24, 2013

(30) Foreign Application Priority Data

Apr. 23, 2012   (KR) .................... 10-2012-0042119

(51) Int. Cl.
    *G11C 7/00*    (2006.01)
(52) U.S. Cl.
    USPC .................................... 365/230.08
(58) Field of Classification Search
    CPC .................................... G11C 7/1039
    USPC .................................... 365/230.08
    See application file for complete search history.

(56) References Cited

U.S. PATENT DOCUMENTS

| 2004/0123061 A1* | 6/2004 | Oh .............................. 711/167 |
| 2009/0150701 A1* | 6/2009 | Nagao et al. .................. 713/324 |
| 2010/0214865 A1* | 8/2010 | Yang ....................... 365/230.08 |

FOREIGN PATENT DOCUMENTS

KR           100670729 B1     1/2007

* cited by examiner

*Primary Examiner* — Hoai V Ho
*Assistant Examiner* — Min Huang
(74) *Attorney, Agent, or Firm* — William Park & Associates Patent Ltd.

(57) ABSTRACT

A pipe register circuit includes an address storage section configured to temporarily and sequentially store address signals input from an external in correspondence with a read command signal input together with the address signals, and an address output control section configured to generate an address output control signal for allowing the address signals stored in the address storage section to be output in correspondence with CAS latency, and output the address output control signal to the address storage section.

13 Claims, 6 Drawing Sheets

PIPE REGISTER CIRCUIT AND SEMICONDUCTOR MEMORY APPARATUS HAVING THE SAME

CROSS-REFERENCES TO RELATED APPLICATION

The present application claims priority under 35 U.S.C. §119(a) to Korean application number 10-2012-0042119, filed on Apr. 23, 2012, in the Korean Intellectual Property Office, which is incorporated herein by reference in its entirety as set forth in full.

BACKGROUND

1. Technical Field

The present invention relates to a semiconductor memory apparatus, and more particularly, to a pipe register circuit capable of improving an operation speed and a semiconductor memory apparatus having the same.

2. Related Art

In general, in a semiconductor memory apparatus such as a dynamic random access memory (DRAM), data stored in a cell is read through a data output circuit. When the stored data is read, the data is output after being delayed by a predetermined number of clocks from a clock, on which a read command is input, by CAS latency CL according to JEDEC specifications.

Figure 1:
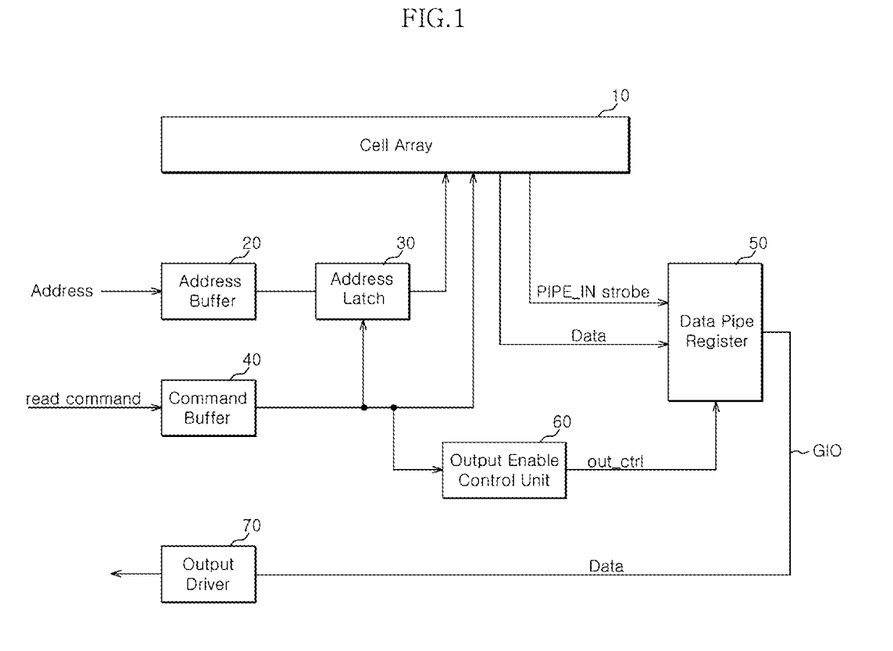
FIG. 1 is a block diagram illustrating a partial configuration of a general semiconductor memory apparatus.
Figure 2:
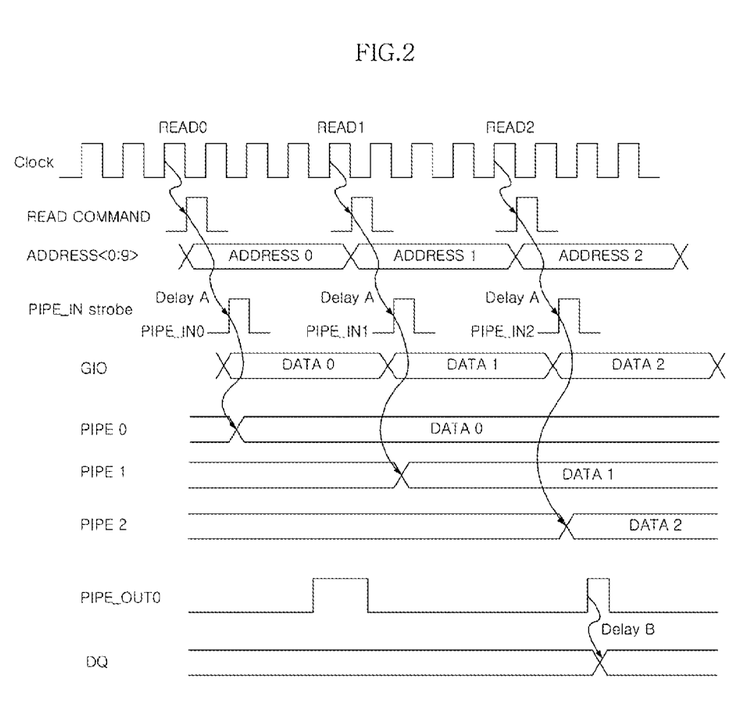
FIG. 2 is a timing diagram for explaining a data read operation of a general semiconductor memory apparatus.

FIG. 1 is a block diagram illustrating a part of a general semiconductor memory apparatus, and FIG. 2 is a timing diagram for explaining a data read operation of the general semiconductor memory apparatus.

Referring to FIG. 1, the general semiconductor memory apparatus includes a cell array 10, an address buffer 20, an address latch 30, a command buffer 40, a data pipe register 50, an output enable control unit 60, and an output driver 70.

The operation of the semiconductor memory apparatus having the configuration will be described with reference to FIG. 2. In the general semiconductor memory apparatus, when a read command is input from an external, the input read command is input to the command buffer 40. When the read command is output from the command buffer 40 in synchronization with a clock, a corresponding address signals address, which has been latched in the address latch 30 after being input together with the read command, is output.

Data stored in a corresponding cell of the cell array 10 is read by the output address signals address, and is temporarily stored in the data pipe register 50. There is a delay, noted by delay A, when the read command is input from an external and the read data is stored in the data pipe register 50.

Then, the read data stored in the data pipe register 50 is transferred to a global input/output line GIO in response to an output control signal out_ctrl output from the output enable control unit 60 in correspondence with CAS latency CL, and then is output to an external through the output driver 70. There is a delay, noted by delay B, when the read command is output from the data pipe register 50 and then is output through the output driver 70.

The general semiconductor memory apparatus configured as above includes the data pipe register 50 for each data input/output pad (not illustrated). When the number of data input/output pads is large, the data pipe register 50 is provided by the number of data input/output pads, resulting in an increase in the area of the semiconductor memory apparatus.

Furthermore, in the general semiconductor memory apparatus configured as above, there is delay, notably delay A and delay B, from when the read command is input to when the read data is output to an external, resulting in a reduction of the operation speed of the semiconductor memory apparatus.

SUMMARY

A pipe register circuit capable of improving an operation speed when read data is output and a semiconductor memory apparatus having the same are described herein.

A pipe register circuit capable of achieving an area reduction effect as the number of data input/output pads is large and a semiconductor memory apparatus having the same are described herein.

In one embodiment of the present invention, a pipe register circuit includes: an address storage section configured to temporarily and sequentially store address signals input from an external in correspondence with a read command signal input together with the address signals; and an address output control section configured to generate an address output control signal for allowing the address signals stored in the address storage section to be output in correspondence with CAS latency, and output the address output control signal to the address storage section.

In one embodiment of the present invention, a semiconductor memory apparatus includes: a cell array including a plurality of memory cells arranged in order to store data; a pipe register configured to receive and temporarily store address signals input from an external, generate an address output control signal for controlling output of the address signals, and output data stored in the cell array by the generated address output control signal; and an output driver configured to output data, which is output by the address signals, to an external.

BRIEF DESCRIPTION OF THE DRAWINGS

Features, aspects, and embodiments are described in conjunction with the attached drawings, in which:

FIGS. 4a to 4c are block diagrams illustrating a configuration of an address storage section of a semiconductor memory apparatus according to an embodiment;

DETAILED DESCRIPTION

Hereinafter, a pipe register circuit and a semiconductor memory apparatus according to the present invention will be described in detail with reference to the accompanying drawings through an exemplary embodiment.

Figure 3:
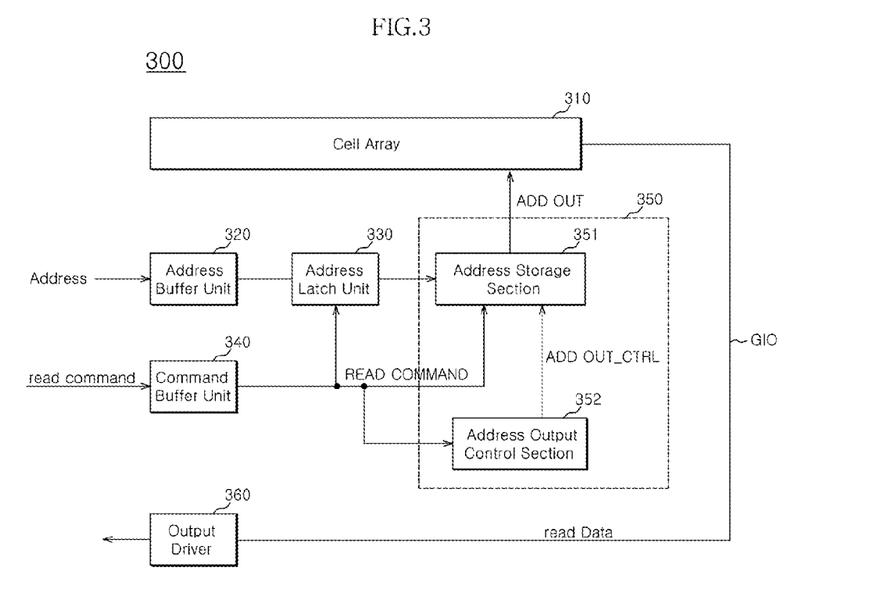
FIG. 3 is a block diagram illustrating a partial configuration of a semiconductor memory apparatus according to an embodiment.

FIG. 3 is a block diagram illustrating a partial configuration of a semiconductor memory apparatus according to an embodiment.

Referring to FIG. 3, a semiconductor memory apparatus 300 according to the embodiment may include a cell array 310, an address buffer unit 320, an address latch unit 330, a command buffer unit 340, a pipe register 350, and an output driver 360.

The cell array 310 includes a plurality of memory cells arranged in order to store data.

The address buffer unit 320 is configured to receive an address signal address from an external, buffer the address signal, and output the buffered signal to the address latch unit 330.

The address latch unit 330 is configured to receive and latch the address signal address output from the address buffer unit 320, and output a corresponding latched address signal to the pipe register 350 when a read command is input from the command buffer unit 340.

The command buffer unit 340 is configured to receive a read command signal read command from an external, buffer the read command signal, and output the buffered signal to the address latch unit 330 and the pipe register 350.

The pipe register 350 is configured to receive the read command signal READ COMMAND and the address signal address, and output an address output signal ADD OUT such that data stored in a corresponding cell of the cell array 310 is read. The pipe register 350 may include an address storage section 351 and an address output control section 352.

The address storage section 351 is configured to temporarily store the address signal address output from the address latch unit 330, and output the address output signal ADD OUT for outputting the temporarily stored address signal to the cell array 310 by an address output control signal ADD OUT_CTRL output from the address output control section 352. The structure of the address storage section 351 will be described in detail with reference to FIGS. 4a to 4c.

The address output control section 352 is configured to receive the read command signal READ COMMAND output from the command buffer unit 340, generate the address output control signal ADD OUT_CTRL in correspondence with CAS latency CL, and output the address output control signal ADD OUT_CTRL to the address storage section 351. The address output control signal ADD OUT_CTRL generated by the address output control section 352 includes delay A indicating delay occurring when the read command is input to when and an address signal address corresponding to the read command is stored in the address storage section 351. The address output control section 352 will be described in detail with reference to FIGS. 4a to 4c.

The output driver 360 is configured to receive read data output from the cell array 310 by the address output signal ADD OUT output from the pipe register 350, and output the read data to an external.

Figure 4A:
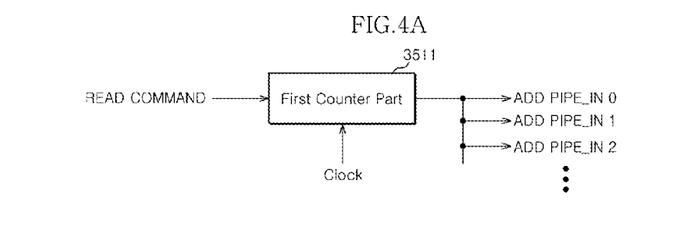
Figure 4B:
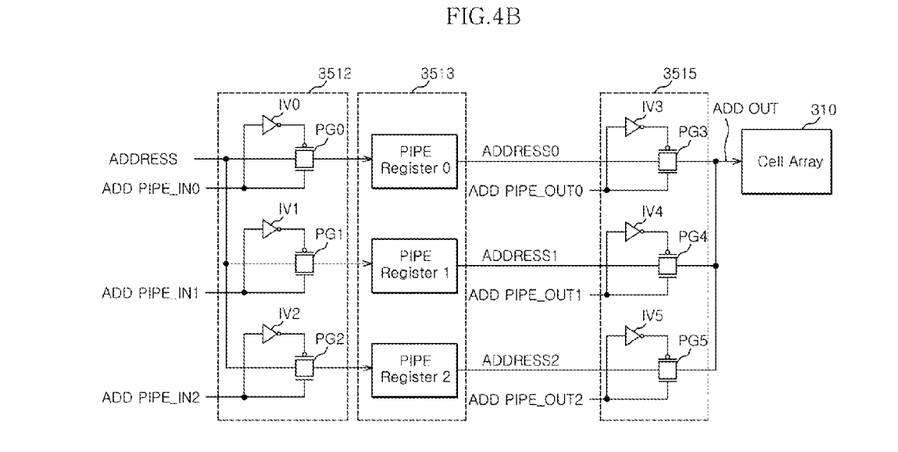
Figure 4C:
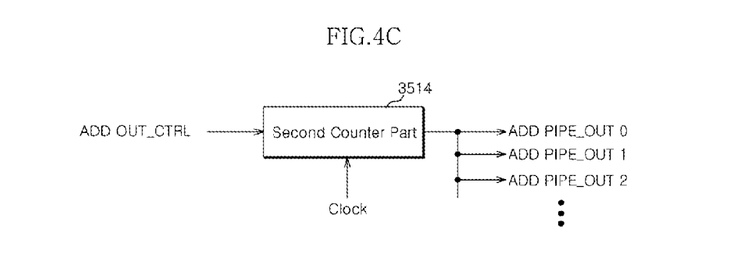

FIGS. 4a to 4c are block diagrams illustrating the configuration of the address storage section of the semiconductor memory apparatus according to the embodiment.

Referring to FIGS. 4a to 4c, the address storage section 351 of the semiconductor memory apparatus according to the embodiment includes a first counter part 3511, a first transmission part 3512, a register part 3513, a second counter part 3514, and a second transmission part 3515.

As illustrated in FIG. 4a, when the read command signal READ COMMAND is input from the command buffer unit 340, the first counter part 3511 outputs a plurality of address pipe input control signals ADD PIPE_IN0 to ADD PIPE_IN2 such that address signals ADDRESS0 to ADDRESS2 input from the address latch unit 330 are sequentially stored in synchronization with the clock.

The first transmission part 3512 is configured to receive the read command signal READ COMMAND, the address signals ADDRESS0 to ADDRESS2, and the address pipe input control signals ADD PIPE_IN0 to ADD PIPE_IN2, and output the received signals to the register part 3513. The first transmission part 3512 includes a plurality of inverters IV0 to IV2 and a plurality of pass gates PG0 to PG2 as illustrated in FIG. 4b.

The register part 3513 is configured to receive the address signals ADDRESS0 to ADDRESS2 transmitted from the first transmission part 3512, and sequentially store the received address signals ADDRESS0 to ADDRESS2 in a plurality of pipe registers PIPE Register 0 to PIPE Register 2 in correspondence with an address input control signals ADD PIPE_IN0 to ADD PIPE_IN2.

As illustrated in FIG. 4c, the second counter part 3514 is configured to receive the address output control signal ADD OUT_CTRL output from the address output control section 352, and output a plurality of address pipe output control signals ADD PIPE_OUT0 to ADD PIPE_OUT2 such that the address signals stored in the register part 3513 are sequentially output.

The second transmission part 3515 is configured to receive the address signals ADDRESS0 to ADDRESS2 output from the register part 3513 and the address pipe output control signals ADD PIPE_OUT0 to ADD PIPE_OUT2 output from the second counter part 3514, and output the address output signal ADD OUT for outputting the address signals ADDRESS0 to ADDRESS2 in correspondence with the address pipe output control signals ADD PIPE_OUT0 to ADD PIPE_OUT2 to the cell array 310. The second transmission part 3515 includes a plurality of inverters IV3 to IV5 and a plurality of pass gates PG3 to PG5 as illustrated in FIG. 4b.

Figure 5:
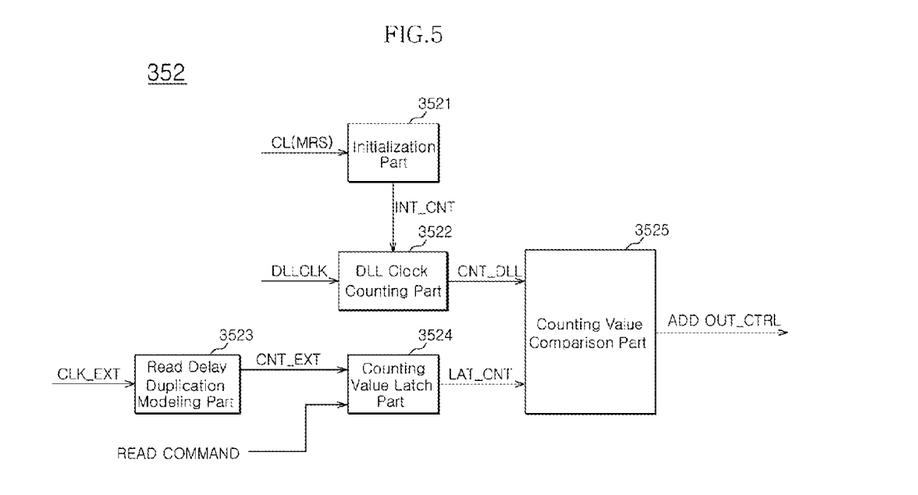
FIG. 5 is a block diagram illustrating a configuration of an address output control section of a semiconductor memory apparatus according to an embodiment.

FIG. 5 is a block diagram illustrating a configuration of the address output control section of the semiconductor memory apparatus according to the embodiment.

Referring to FIG. 5, the address output control section 352 of the semiconductor memory apparatus according to the embodiment may include an initialization part 3521, a DLL clock counting part 3522, a read delay duplication modeling part 3523, a counting value latch part 3524, and a counting value comparison part 3525.

The initialization part 3521 is configured to provide the DLL clock counting part 3522 with an initial counting value INT_CNT corresponding to the CAS latency CL. The initial counting value INT_CNT output from the initialization part 3521 may be changed according to design of a designer.

The DLL clock counting part 3522 is configured to output a DLL clock counting value CNT_DLL, which is counted from the initial counting value INT_CNT provided by the initialization part 3521, in response to a DLL clock signal DLLCLK. For example, when the initial counting value INT_CNT has been designed to 1 according to the CAS latency CL, the DLL clock counting part 3522 outputs the DLL clock counting value CNT_DLL, which is counted from 1, in response to the DLL clock signal DLLCLK.

The read delay duplication modeling part 3523 is configured to output an external clock counting value CNT_EXT, which is counted in synchronization with an external clock signal CLK_EXT, as a value obtained by modeling the degree of delay between the DLL clock signal DLLCLK and the external clock signal CLK_EXT. The read delay duplication modeling part 3523 is modeled to include the delay A indicating delay occurring during when the read command is input to when an address signal address corresponding to the read command is stored in the address storage section 351.

The counting value latch part 3524 is configured to latch the external clock counting value CNT_EXT, which is output from the read delay duplication modeling part 3523, in response to the read command signal READ COMMAND.

The counting value comparison part 3525 is configured to compare the DLL clock counting value CNT_DLL output from the DLL clock counting part 3522 with the external clock counting value CNT_EXT output from the counting value latch part 3524, and output the address output control signal ADD OUT_CTRL that is activated at the time point at which the two values are substantially equal to each other. The counting value comparison part 3525 may be configured by a general comparator. The address output control signal ADD OUT_CTRL has reflected the CAS latency CL and may include the delay A.

The read operation of the semiconductor memory apparatus configured as above according to the embodiment will be described below.

Figure 6:
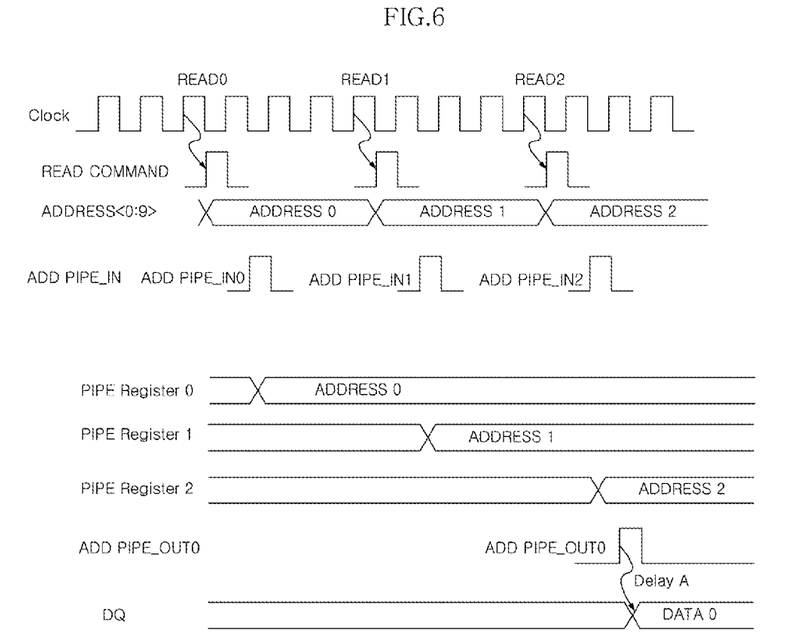
FIG. 6 is a timing diagram for explaining a read operation of a semiconductor memory apparatus according to an embodiment.

FIG. 6 is a timing diagram for explaining the read operation of the semiconductor memory apparatus according to the embodiment.

Referring to FIG. 6, in the semiconductor memory apparatus 300 according to the embodiment, when the read command signal READ COMMAND is input from an external, the input read command signal READ COMMAND is input to the command buffer unit 340, and is output from the command buffer unit 340 in synchronization with the clock. A corresponding address signals address, which has been latched in the address latch unit 330 after being input together with the read command, is output.

Then, the corresponding address signals address is temporarily stored in the register part 3513 in a sequential manner according to the address pipe input control signals ADD PIPE_IN0 to ADD PIPE_IN2 output from the first counter part 3511 of the address storage section 351, and a corresponding address signal address is output in correspondence with the address output signal ADD OUT having reflected the CAS latency CL.

Then, the corresponding address signal address is input to the cell array 310, so that a data signal data stored in a corresponding cell that corresponds to the corresponding address signal address is output to the output driver 360 through the global input/output line GIO.

As described above, in the semiconductor memory apparatus 300 according to the embodiment, data is output by reflecting the CAS latency CL, that is, the cell array 310 directly outputs the data signal data to the output driver 360, so that it is possible to remove delay B occurring until the conventional data pipe register outputs a signal to the output driver, resulting in the improvement of the operation speed thereof.

While certain embodiments have been described above, it will be understood to those skilled in the art that the embodiments described are by way of example only. Accordingly, the pipe register circuit and the semiconductor memory apparatus described herein should not be limited based on the described embodiments. Rather, the pipe register circuit and the semiconductor memory apparatus described herein should only be limited in light of the claims that follow when taken in conjunction with the above description and accompanying drawings.

What is claimed is:

1. A pipe register circuit comprising:
an address storage section configured to temporarily and sequentially store address signals input from an external in correspondence with a read command signal input together with the address signals; and
an address output control section configured to generate an address output control signal for allowing the address signals stored in the address storage section to be output in correspondence with CAS latency, and output the address output control signal to the address storage section so that data of a cell array is not outputted to the address storage section but is outputted to an output driver,
wherein the address storage section comprises:
a first counter part configured to output a plurality of address pipe input control signals such that the address signals are sequentially stored in synchronization with the clock, when the read command signal is input;
a first transmission part configured to sequentially transmit the address signals in correspondence with the address pipe input control signals output from the first counter part;
a register part configured to sequentially store the address signals transmitted from the first transmission part;
a second counter part configured to output address pipe output control signals such that the address signals stored in the register part are sequentially output in correspondence with the address output control signal output from the address output control section; and
a second transmission part configured to transmit the address signals in correspondence with the address pipe output control signals output from the second counter part.

2. The pipe register circuit according to claim 1, wherein the address output control signal includes delay occurring when the address signals are input and stored in the address storage section.

3. The pipe register circuit according to claim 2, wherein the address output control section comprises:
an initialization part configured to set an initial counting value corresponding to the CAS latency;
a DLL clock counting part configured to output a DLL clock counting value that is counted from the initial counting value;
a read delay duplication modeling part configured to count an external clock signal and output an external clock counting value;
a counting value latch part configured to latch the external clock counting value; and
a counting value comparison part configured to compare the DLL clock counting value with the external clock counting value, and output the address output control signal.

4. The pipe register circuit according to claim 3, wherein the read delay duplication modeling part is configured to be modeled to include delay occurring when the address signals are input and stored in the address storage section, which is obtained by modeling the DLL clock signal and the external clock signal.

5. The pipe register circuit according to claim 3, wherein the counting value comparison part is configured to output the address output control signal at a time point at which the DLL clock counting value is substantially equal to the external clock counting value.

6. A semiconductor memory apparatus comprising:
a cell array including a plurality of memory cells arranged in order to store data;
a pipe register including:
an address storage section configured to temporarily and sequentially store the address signals input through the address buffer unit; and
an address output control section configured to generate an address output control signal for allowing the address signals stored in the address storage section to be output in correspondence with CAS latency, and output the generated address output control signal to the address storage section; and an output driver configured to output data, which is output by the address signals, to an external, wherein the pipe register is configured to control outputting the data stored in the cell array to the output driver though a data line without passing through the pipe register, wherein the address output control section comprises:

an initialization part configured to set an initial counting value corresponding to the CAS latency;

a DLL clock counting part configured to output a DLL clock counting value that is counted from the initial counting value;

a read delay duplication modeling part configured to count an external clock signal and output an external clock counting value;

a counting value latch part configured to latch the external clock counting value; and a counting value comparison part configured to compare the DLL clock counting value with the external clock counting value, and output the address output control signal.

7. The semiconductor memory apparatus according to claim 6, wherein the pipe register is configured to operate in correspondence with a read command signal input from an external together with the address signals.

8. The semiconductor memory apparatus according to claim 7, further comprising:

an address buffer unit configured to buffer the address signals;

a command buffer unit configured to buffer the read command signal; and an address latch unit configured to receive and latch the address signal output from the address buffer unit and output a corresponding latched address signal to the pipe register when the read command is input from the command buffer unit.

9. The semiconductor memory apparatus according to claim 6, wherein the an address storage section comprises:

a first counter part configured to output a plurality of address pipe input control signals such that the address signals are sequentially stored in synchronization with the clock, when the read command signal is input;

a first transmission part configured to sequentially transmit the address signals in correspondence with the address pipe input control signals output from the first counter part;

a register part configured to sequentially store the address signals transmitted from the first transmission part;

a second counter part configured to output address pipe output control signals such that the address signals stored in the register part are sequentially output in correspondence with the address output control signal output from the address output control section; and a second transmission part configured to transmit the address signals in correspondence with the address pipe output control signals output from the second counter part.

10. The semiconductor memory apparatus according to claim 9, wherein the first and second transmission parts comprise of a plurality of inverters and pass gates.

11. The semiconductor memory apparatus according to claim 6, wherein the address output control signal includes delay occurring when the address signals are input and stored in the pipe register.

12. The semiconductor memory apparatus according to claim 6, wherein the read delay duplication modeling part is configured to be modeled to include delay occurring when the address signals are input and stored in the pipe register, which is obtained by modeling the DLL clock signal and the external clock signal.

13. The semiconductor memory apparatus according to claim 6, wherein the counting value comparison part is configured to output the address output control signal at a time point at which the DLL clock counting value is substantially equal to the external clock counting value.

* * * * *